(12) United States Patent
Mohammad et al.

(10) Patent No.: US 8,884,637 B2
(45) Date of Patent: *Nov. 11, 2014

(54) METHOD AND APPARATUS FOR TESTING A MEMORY DEVICE

(71) Applicant: QUALCOMM Incorporated, San Diego, CA (US)

(72) Inventors: Baker S. Mohammad, Austin, TX (US); Hong S. Kim, Austin, TX (US); Paul D. Bassett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/900,775

(22) Filed: May 23, 2013

(65) Prior Publication Data

US 2013/0257466 A1 Oct. 3, 2013

Related U.S. Application Data

(63) Continuation of application No. 12/716,341, filed on Mar. 3, 2010, now Pat. No. 8,466,707.

(51) Int. Cl.
*G01R 31/26* (2014.01)
*G11C 29/12* (2006.01)
*G11C 29/50* (2006.01)
*G11C 11/41* (2006.01)

(52) U.S. Cl.
CPC .......... *G01R 31/2642* (2013.01); *G11C 11/41* (2013.01); *G11C 29/12* (2013.01); *G11C 29/50* (2013.01)
USPC ................................ 324/750.01; 324/762.01

(58) Field of Classification Search
CPC .... G01R 31/2642; G11C 29/50; G11C 29/12; G11C 11/41
See application file for complete search history.

(56) References Cited

U.S. PATENT DOCUMENTS

| | | | |
|---|---|---|---|
| 6,731,179 B2 | 5/2004 | Abadeer et al. | |
| 6,815,970 B2 | 11/2004 | Rost et al. | |
| 6,989,698 B2 | 1/2006 | Jeong | |
| 7,177,201 B1 | 2/2007 | Takayanagi | |
| 7,183,791 B2 | 2/2007 | Walker et al. | |
| 7,542,368 B2 | 6/2009 | Ishikura et al. | |
| 7,642,864 B2 | 1/2010 | Chuang et al. | |
| 7,872,930 B2* | 1/2011 | Chen et al. | 365/201 |
| 8,466,707 B2* | 6/2013 | Mohammad et al. | 324/762.09 |
| 2005/0099202 A1* | 5/2005 | Houston et al. | 324/765 |
| 2006/0267621 A1 | 11/2006 | Harris et al. | |

(Continued)

OTHER PUBLICATIONS

International Preliminary Report on Patentability—PCT/US2011/026826, The International Bureau of WIPO—Geneva, Switzerland—Mar. 15, 2012.

(Continued)

*Primary Examiner* — Jermele M Hollington
(74) *Attorney, Agent, or Firm* — Peter Michael Kamarchik; Nicholas J. Pauley; Joseph Agusta (57) ABSTRACT

In a particular embodiment, a method includes receiving a testing activation signal at a controller coupled to a semiconductor device. The method further includes biasing a well of at least one transistor of the semiconductor device in response to the received testing activation signal. The bias is provided by a biasing circuit that is responsive to the controller. While the well is biased, a test of the semiconductor device is performed to generate testing data.

25 Claims, 4 Drawing Sheets

(56) References Cited

U.S. PATENT DOCUMENTS

| | | |
|---|---|---|
| 2007/0162801 A1 | 7/2007 | Moore |
| 2008/0144412 A1 | 6/2008 | Shen et al. |
| 2008/0181036 A1* | 7/2008 | Akiyama ............... 365/201 |
| 2008/0252376 A1 | 10/2008 | Miao et al. |
| 2009/0132849 A1 | 5/2009 | Adams et al. |
| 2009/0189703 A1 | 7/2009 | Chuang et al. |
| 2009/0285044 A1* | 11/2009 | Chen et al. ............. 365/201 |
| 2012/0194222 A1 | 8/2012 | Hoefler et al. |

OTHER PUBLICATIONS

International Search Report and Written Opinion—PCT/US2011/026826, ISA/EPO—Jun. 28, 2011.
Kumar S V et al., "Impact of NBTI on SRAM read stability and design for reliability", Proceedings of the 2006 7th International Symposium on Quality Electronic Design—Mar. 27-29, 2006—San Jose, CA, USA, Jan. 1, 2006, p. 6pp, XP009139746, ISBN: 978-0-7695-2523-5.

* cited by examiner

000
METHOD AND APPARATUS FOR TESTING A MEMORY DEVICE

I. CROSS-REFERENCE TO RELATED APPLICATION

The present application is a continuation of and claims priority to U.S. patent application Ser. No. 12/716,341, filed Mar. 3, 2010 (now U.S. Pat. No. 8,466,707) and entitled "Method and Apparatus for Testing a Memory Device," which is herein incorporated by reference in its entirety.

II. FIELD

The present disclosure is generally related to a method and apparatus for testing a memory device.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Reliability of metal-oxide-semiconductor field-effect-transistor (MOSFET) devices is a growing concern as the size of these devices is reduced. Major contributors to the reliability issues of MOSFET devices include negative bias temperature instability (NBTI) in p-type metal-oxide-semiconductor field-effect-transistor (PMOS) devices and aging effects in both PMOS and n-type metal-oxide-semiconductor field-effect-transistor (NMOS) devices.

NBTI changes the charge density at the interface of the gate oxide and the underlying semiconductor material with prolonged use of the PMOS device. The two types of charge densities thought to contribute to NBTI are the fixed oxide charge density ($Q_f$) and the interface trapped charge density ($Q_{it}$). Fixed oxide charge is a positive charge in the gate oxide layer near the oxide/semiconductor interface of the PMOS. Interface trapped charges accumulate as a result of the formation of interface traps due to the mismatch between the gate oxide material and the semiconductor material. When the gate of the PMOS device is at a logic low and the device is activated, positive charges are trapped by the interface traps. With prolonged use of the PMOS device, additional interface traps form resulting in more positive charges trapped at the gate oxide/semiconductor interface. Any increase in the positive charge density of either of these charges leads to a threshold voltage shift of the PMOS device. The threshold voltage shift results in a higher threshold voltage level that reduces the margin for activation and stability of the PMOS because the gate voltage has to drop further, and stay lower, for the device to be activated and to remain activated (e.g., PMOS devices are activated by a logic low at the gate). The reduced margin reduces the reliability of the PMOS device.

Aging effects may reduce the reliability of MOSFET devices, including both PMOS and NMOS devices. Some MOSFET devices may be more susceptible to aging effects as a result of process variation. Process variation may exist on a semiconductor wafer and on a single semiconductor die.

IV. SUMMARY

A method and apparatus are disclosed to measure, or characterize, NBTI and aging of MOSFETs in a semiconductor device, such as a memory cell. For example, a controller of the semiconductor device may receive an activation signal from a remote device to initiate a test of the semiconductor device. The controller sends a control signal to a bias circuit to cause the bias circuit to provide a bias voltage to a well of at least one transistor of the semiconductor device. A test of the semiconductor device is performed while the bias voltage is applied to generate testing data and portions of the semiconductor device that fail the test may be repaired. For example, when the semiconductor device is a memory, the controller may send a control signal to the memory causing the memory to perform either a read or a write operation while the bias voltage is applied to the memory device, After the read or write operation is performed, the controller determines whether the operation was successful. If the operation was not successful, the controller may identify the memory locations where the operation was not successful, and the memory cells at the identified locations my be repaired.

In a particular embodiment, a method includes receiving a testing activation signal at a controller coupled to the semiconductor device. The method also includes biasing a well of at least one transistor of the semiconductor device in response to the received testing activation signal. The bias is provided by a biasing circuit responsive to the controller. The method also includes performing a test of the semiconductor device to generate testing data while the well is biased.

In another particular embodiment, an apparatus includes a bias circuit configured to provide a bias voltage to a well terminal of at least one transistor of the semiconductor device. The apparatus further includes a controller coupled to the bias circuit. The controller includes an activation interface configured to receive an activation signal and a bias circuit interface configured to send an enable signal to the bias circuit in response to the activation signal. The controller also includes a semiconductor device interface coupled to the semiconductor device. The semiconductor device interface is configured to initiate a test of the semiconductor device for generating testing data and to collect the testing data from the semiconductor device.

In another particular embodiment, an apparatus includes means for receiving a testing activation signal at a controller coupled to a memory device of a semiconductor device. The apparatus further includes means for biasing a well of at least one transistor of the memory device in response to the received testing activation signal, where the bias is provided by a biasing circuit responsive to the controller. The apparatus further includes means for performing a test of the memory device to generate testing data while the well is biased.

One particular advantage provided by at least one of the disclosed embodiments is that susceptibility to NBTI and aging of MOSFETs in a semiconductor device may be measured, identified and repaired. Thus, a method and apparatus for measuring, or characterizing, susceptibility to NBTI and aging, and repairing the susceptible portion of the semiconductor device, such as memory cells in a memory, is provided.

Other aspects, advantages, and features of the present disclosure will become apparent after review of the entire application, including the following sections: Brief Description of the Drawings, Detailed Description, and the Claims.

VI. DETAILED DESCRIPTION

Figure 1:
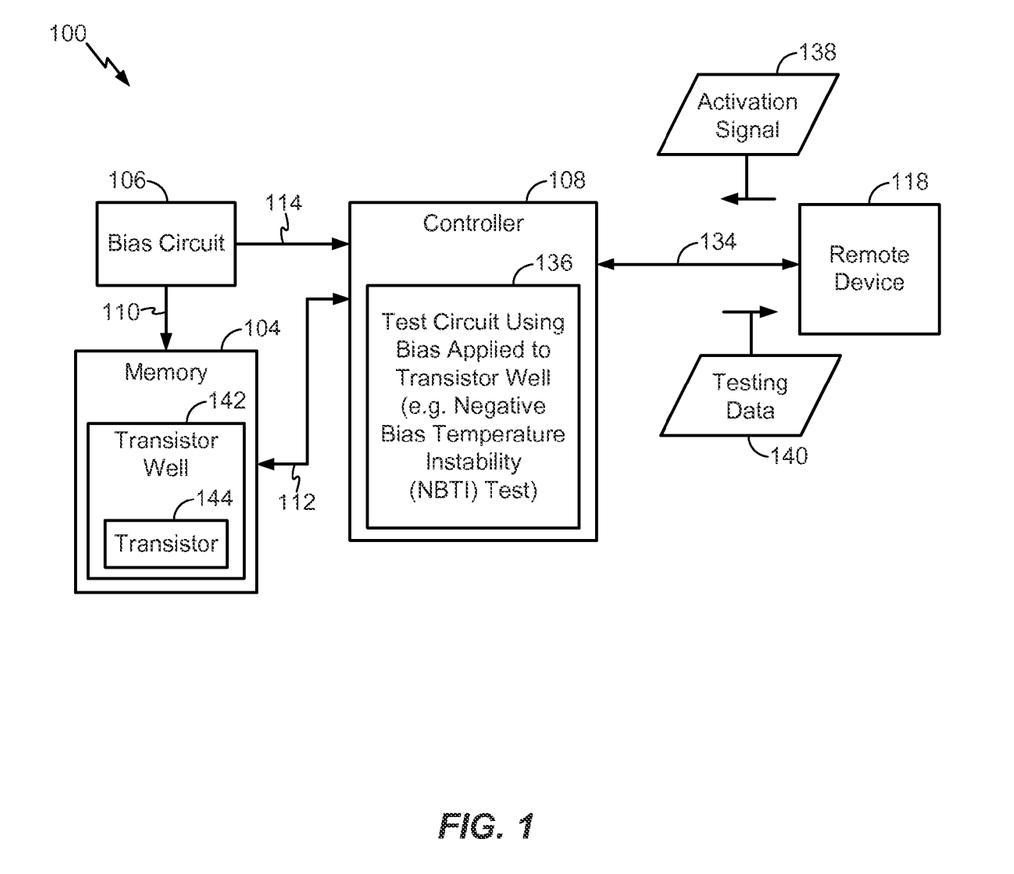
FIG. 1 is a block diagram of a particular illustrative embodiment of an apparatus for testing a memory.

Referring to FIG. 1, a particular illustrative embodiment of an apparatus is disclosed and generally designated 100. The apparatus 100 may include a semiconductor device (e.g. memory) 104, a bias circuit 106, and a controller 108. The controller 108 is connected to the bias circuit 106 via a data path 114. The controller 108 is also coupled to the memory 104 via a data path 112. The data path 112 may allow bi-directional communication between the memory 104 and the controller 108. The bias circuit 106 is connected to the memory 104 via a data path 110. The memory 104, the bias circuit 106, and the controller 108 may be integrated on a single semiconductor die or each may be provided on a separate semiconductor die. Further, two of the three components may be integrated on a first semiconductor die and the other component may be provided on a second semiconductor die.

The controller 108 may be a built-in self-test (BIST) controller and may be configured to provide a control signal to the bias circuit 106 via the data path 114. In response to the control signal, the bias circuit 106 generates a bias voltage. The bias voltage may be applied to the memory 104 via the data path 110. The controller 108 may also be configured to provide a control signal to the memory 104 via the data path 112 to initiate a test of the memory 104. The test of the memory 104 may be performed while the bias voltage is being applied to the memory 104. The controller 108 may be configured to monitor the test of the memory 104 and to collect testing data 140. The controller 108 may be configured to evaluate the testing data 140.

The apparatus 100 may be configured to receive an activation signal 138 from a remote device 118. For example, the remote device 118 may include an Automatic Test Equipment (ATE) system or other testing device, such as used in conjunction with a manufacturing process or used by service personnel to test the memory 104 in the field. The activation signal 138 is provided to initiate a simulation of the effects of NBTI or aging on the memory 104. For example, the controller 108 may be coupled to the remote device 118 via a data path 134 and configured to receive the activation signal 138 from the remote device 118 via the data path 134. The controller 108 may include a testing circuit 136 responsive to the activation signal 138 and configured to initiate a test of the memory 104 while a bias is applied to a transistor well 142 of a transistor 144 of the memory 104 to simulate NBTI. In response to the activation signal 138 from the remote device 118, the controller 108 provides a control signal to the bias circuit 106 and to the memory 104, In response to the control signal, the bias circuit 106 provides the bias voltage to the memory 104 and the memory 104 performs a memory operation, such as a read or a write to one or more memory cells, The bias voltage is applied to one or more MOSFETs, such as the transistor 144, in one or more memory cells in the memory 104 to produce a threshold voltage shift in the MOSFET. NBTI and aging may cause the threshold voltage in MOSFET devices to shift. Shifting the threshold voltage affects the MOSFETs to respond to a logic transition at the gate of the MOSFET device. The applied bias voltage may be used to simulate effects of NBTI and aging by shifting the threshold voltage of the MOSFETs receiving the applied bias voltage. The controller 108 collects the testing data 140 generated by the memory operation, The testing data 140 may be evaluated by the controller 108 or the testing data 140 may be sent to the remote device 118 via the data path 134 to determine a susceptibility of the memory 104 to NBTI, aging, or a combination thereof.

It should be understood that the memory 104 is provided as an illustrative example and that other semiconductor devices utilizing MOSFETs may be substituted and tested while a bias voltage is applied to determine susceptibility NBTI, aging, or a combination thereof.

Figure 2:
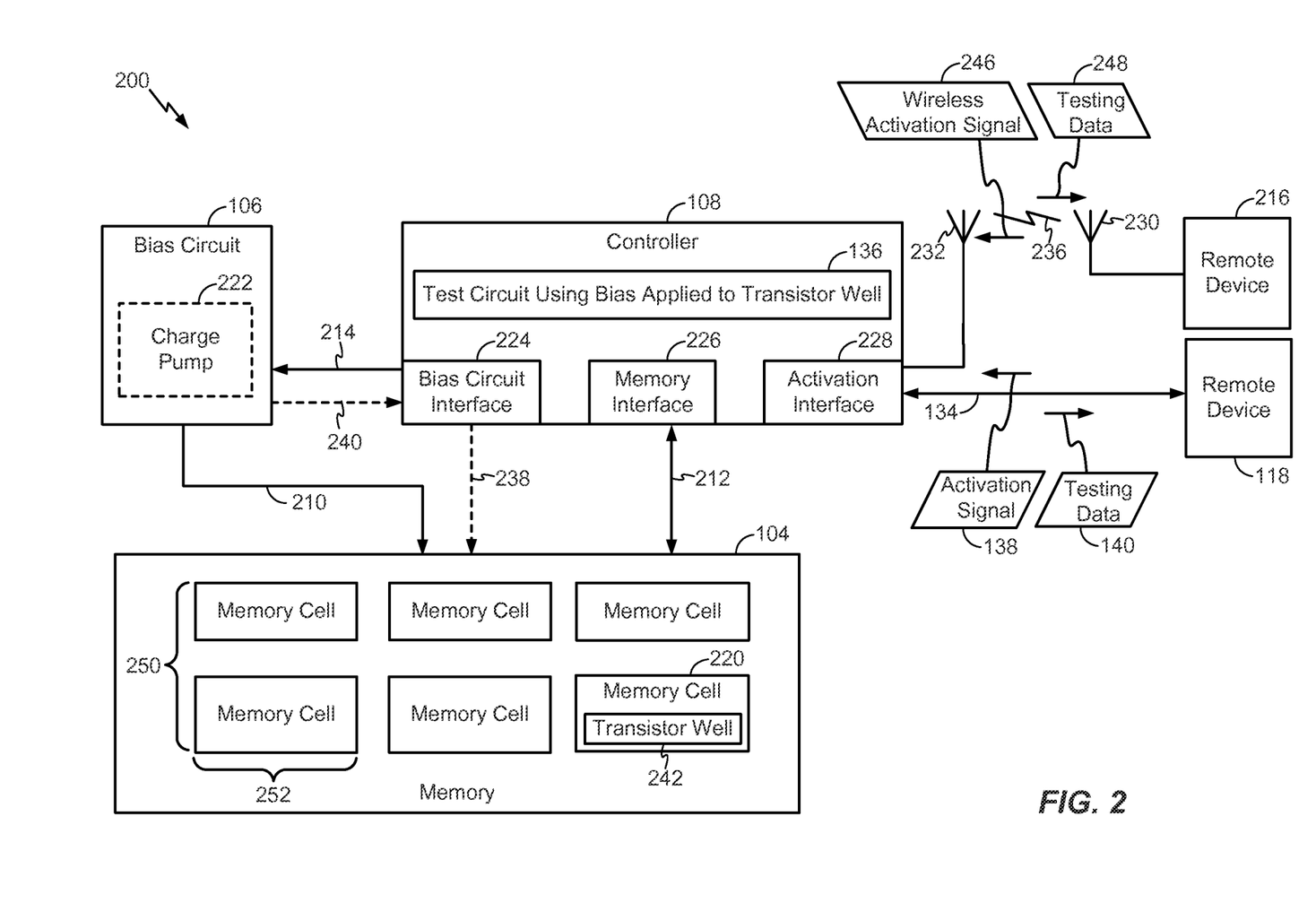
FIG. 2 is a block diagram of a second particular illustrative embodiment of an apparatus for testing a semiconductor device.

FIG. 2 illustrates an apparatus 200, which is similar to the apparatus 100. The apparatus 200 includes the memory 104, the bias circuit 106, and the controller 108. The apparatus 200 may be configured to communicate with remote devices, such as a remote device 216 and the remote device 118 as shown. The controller 108 may be connected to the bias circuit 106 via a data path 214. The controller 108 may also be connected to the memory 104 via a data path 212. The data path 212 may allow bi-directional communication between the memory 104 and the controller 108. The bias circuit 106 may be connected to the memory 104 via a data path 210.

The memory 104 may be implemented as including at least one memory cell 20. For example, the memory cell 220 may be a six transistor memory cell of a static random access memory (SRAM) device. The memory 104 may also include at least one memory cell array 250 and at least one memory column 252. The memory cell array 250 is not limited to the number of memory cells or columns shown in FIG. 2.

The bias circuit 106 includes circuitry for generating a bias voltage level. For example, the bias circuit 106 may be implemented as including a charge pump 222 configured to output a bias voltage when enabled. The bias voltage generated by the bias circuit 106 may be provided directly to the memory 104 via the data path 210 or the bias voltage may be provided to the controller 108 via the data path 240, after which the controller 108 provides the bias voltage to the memory 104 via the data path 238. Alternately, the bias circuit 106 may be built into the controller 108 and configured to provide a bias voltage to the memory 104 via the data path 238.

The controller 108 may include multiple interfaces for communicating with other components. For example, the controller 108 may include a bias circuit interface 224 for communicating with the bias circuit 106, a memory interface 226 for communicating with the memory 104, and an activation interface 228 for communicating with the remote device 216 and the remote device 118. The controller 108 may include a testing circuit 136 configured to initiate a test of the memory 104 while a bias is applied to a transistor well 242 of the memory cell 220 to simulate NBTI.

The activation interface 228 may be configured to communicate with one or more remote devices, such as the remote device 216 and the remote device 118. For example, the activation interface 228 may include an antenna 232 and supporting circuitry (e.g., transceiver) to wirelessly communicate with the remote device 216. The remote device 216 also includes an antenna 230 to send and receive wireless signals. The remote device 216 may be configured to send a wireless activation signal 246 over a wireless communication link 236 that is configured to cause the controller 108 to perform a test of the memory 104. The activation interface 228 may also be configured to communicate with the remote device 118 via a physical connection 134. The remote device 118 may be configured to send an activation signal 138 via, the physical connection 134 to cause the controller 10$ to perform a test of the memory 104. The controller 108 may also be configured to provide collected testing data 248 to the remote device 216 via the wireless communication link 236 and collected testing data 140 to the remote device 118 via the physical connection 134.

The wireless activation signal 246 and the activation signal 138 may include test parameters that affect the test implementation or may cause the controller 108 to implement a predetermined test. Test parameters may include the desired bias voltage level, test duration, operation to be performed on the memory 104, number of iterations of the test, voltage level increment for incrementing the bias voltage level for each iteration, memory location(s) to be tested, etc. The wireless communication link 236 may utilize any type of wireless standard. For example, the wireless communication link 236 may be configured to utilize any of the IEEE 802 standards such as IEEE 802.11 (wireless local area network (WLAN)), IEEE 802.15 (personal area network (PAN), including Bluetooth and ZigBee), IEEE 802.16 (worldwide interoperability for microwave access (WiMAX)), IEEE 802.20 (mobile broadband wireless access (MBWA)), IEEE 802.22 (wireless regional area network (WRAN)), and Ultra-wideband (UWB).

The memory interface 226 may be configured to communicate with the memory 104 via the data path 212. In response to the activation signal 138 or the wireless activation signal 246, the controller 108 provides a control signal to the memory 104 to initiate a test of the memory 104. In response to the control signal, the memory 104 performs one or more operations. For example, the control signal may cause the memory 104 to perform a read operation or a write operation. The controller 108 collects testing data via the data path 212 and the memory interface 226. The testing data may include whether the read or write operation was successful and the memory location of any failed memory cells. The testing data may also include one or more bias voltage levels applied to the memory 104. The collected testing data may be provided to the remote device 216 as the testing data 248 via the wireless communication link 236 or provide to the remote device 118 as the testing data 140 via the physical connection 134.

The bias circuit interface 224 may be configured to enable communication with the bias circuit 106 via the data path 214. In response to the activation signal 138 or the wireless activation signal 246, the controller 108 provides a control signal to the bias circuit 106 to generate a bias voltage to be applied during the one or more operations performed by the memory 104. In response to the control signal, the bias circuit 106 generates a bias voltage and provides the bias voltage to the memory 104. Alternatively, the bias voltage may be provided to the controller 108 via the data path 240 and then to the memory 104 from the bias circuit interface 224 of the controller 108 via the data path 238.

The bias voltage level may be determined by the control signal from the controller 108. The controller 108 may also cause the bias circuit 106 to generate the bias voltage at multiple voltage levels in an iterative fashion. For example, the control signal may cause the bias circuit 106 to generate a bias voltage of 0.5 volts above a positive supply voltage VDD for a predetermined time period (e.g., 1.0 second), and then increase the bias voltage by 0.1 volts for the predetermined period of time, and so on. The controller 108 may provide multiple control signals to cause the bias circuit 106 to generate bias voltages at different levels. For example, a first control signal may cause the bias circuit 106 to generate a bias voltage level of 0.5 volts above VDD and a second control signal, sent some time after the first control signal, may cause the bias circuit 106 to increment the bias voltage level by 0.1 volts. In either case, the controller 108 enables the generation of the bias voltage.

Figure 3:
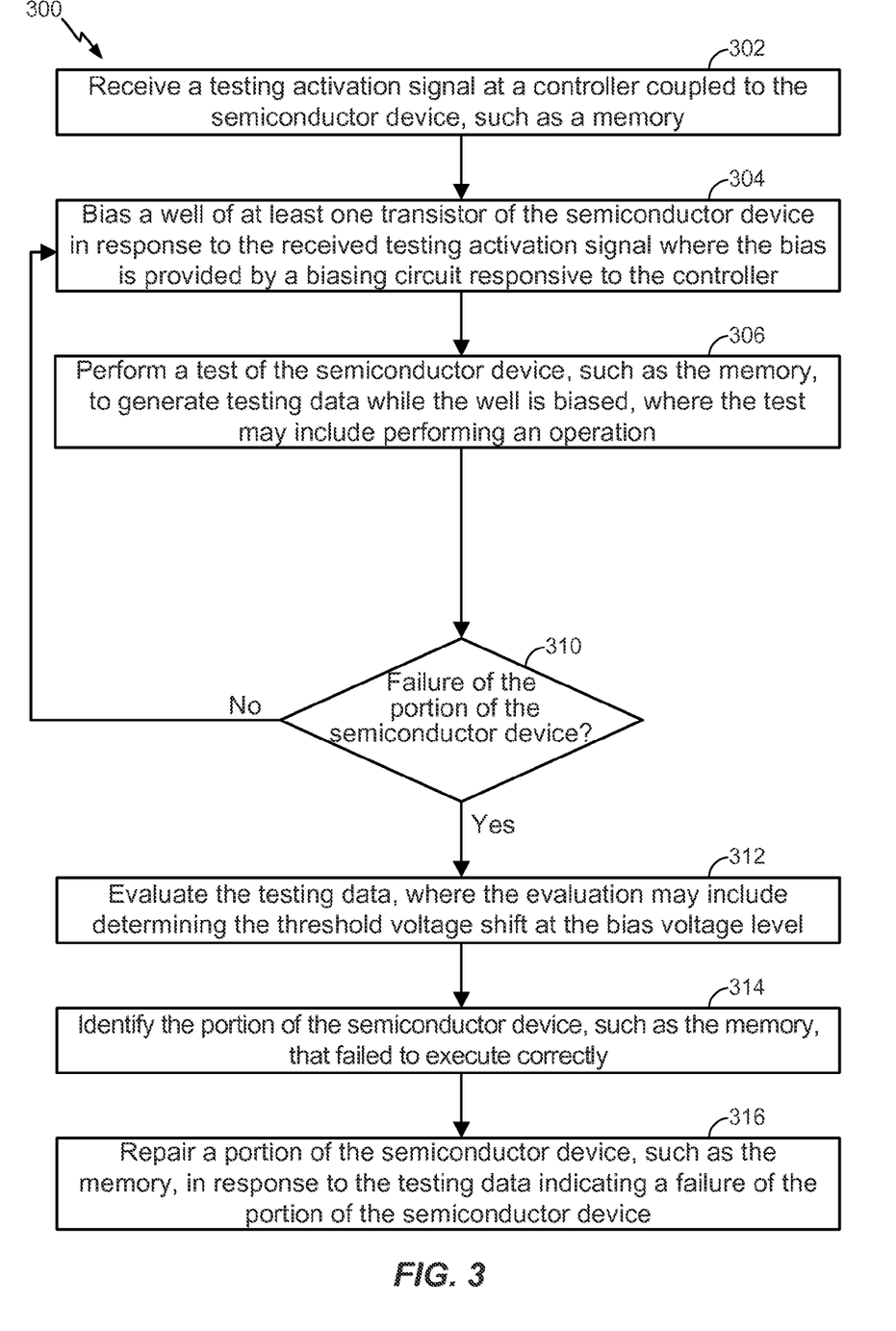
FIG. 3 is a flow chart of a particular illustrative embodiment of a method of testing a semiconductor device.

Referring to FIG. 3, a particular embodiment of a method 300 is illustrated. The method 300 includes receiving a testing activation signal at a controller coupled to a semiconductor device, such as a memory at 302. For example, the wireless activation signal 246 may be received from the remote device 216 over the wireless communication link 236 of FIG. 2. The remote device 216 may be equipped with the antenna 230 to send the wireless activation signal. The controller 108 may be equipped with the antenna 232 and the activation interface 228 to receive the wireless activation signal 246. Alternatively, or in addition, the activation signal 138 may be received at the activation interface 228 from the remote device 118 via the physical connection 134. The wireless activation signal 246 and the activation signal 138 may include test parameters that affect the test implementation or may cause the controller 108 to implement a predetermined test The method further includes biasing a well of at least one transistor of the semiconductor device, such as the memory, in response to the received testing activation signal or the wireless activation signal where the bias is provided by a biasing circuit responsive to the controller, at 304. For example, in response to the received activation signal 138 or the wireless activation signal 246, the controller 108 provides the control signal to the bias circuit 106 of FIG. 2. The bias circuit 106 generates a bias voltage in response to the control signal and the bias voltage is provided to the memory 104. The bias voltage may be provided to the memory 104 from the bias circuit 106 via the data path 210, or the bias voltage may be provided to the controller 108 via the data path 240 and then to the memory 104 from the controller 108 via the data path 238. Alternatively, the bias circuit 106 may be provided as part of the controller 108 and the generated bias voltage may be provided to the memory 104 via the data path 238.

The bias voltage provided to the memory 104 may be applied to at least one of the wells of the MOSFETs in the memory cell. For example, the bias voltage may be applied to the n-well terminal of a PMOS device.

The method further includes performing a test of the semiconductor device, such as the memory, to generate testing data while the well is biased, where the test may include performing an operation, at 306. In addition, multiple bias voltage levels may be applied to the semiconductor device, such as the memory 104, in an iterative fashion. As an example, operation at multiple bias voltage levels can include iteratively increasing the bias voltage until an incorrect operation occurs. Alternatively, the applied bias voltage may be set to a high voltage in which the operation fails and then iteratively reduced until a successful operation occurs. The generated testing data may include the starting and ending bias voltages, the voltage increments for each iteration, the number of iterations, the bias voltage at which the memory operation failed, the number of operations performed at each bias voltage level, and the memory location of the memory cells tested and corresponding results for each tested memory cell. Performing the memory operation may include performing a data read operation from the memory or a data write operation to memory. The method further includes determining whether at least a portion of the semiconductor device fails, at 310. A success or failure of at least a portion of the semiconductor device may be determined by determining whether the semiconductor device failed to correctly execute the operation at the bias voltage level. If it is determined that the at least a portion of the semiconductor device, such as the memory, did not fail, at 310, the method returns to 304 and selects a new bias voltage at a predetermined increment from the previously applied bias voltage, and the method is repeated. However, if it is determined that the at least a portion of the semiconductor device, such as the memory, did fail, the method proceeds to 312.

The method further includes evaluating the testing data, at 312. The evaluation of the testing data may include, determining the threshold voltage shift at the applied bias voltage level. For example, the testing data generated by the performed test may be collected and evaluated by the controller 108 of FIG. 2 to determine an approximate bias voltage at which the at least one memory cell 220 failed and the location of the failed memory cell 220. The collected data may also be provided to the remote device 216 via the wireless communication ink 236 or to the remote device 118 via the physical connection 134. As part of the evaluation, the controller 108, or one or more of the remote devices, 216 and 118, may determine the approximate voltage threshold at which the at least one memory cell 220 failed and may use these approximations to derive or characterize the susceptibility of the memory cell 220 to NBTI and aging.

The method further includes identifying the portion of the semiconductor device, such as the memory, that failed to execute correctly, at 314. Optionally, the method may further include repairing a portion of the semiconductor device, such as the a. portion of the memory, in response to the testing data, at 316. For example, if the testing data indicates that at least one memory cell of FIG. 2 failed to correctly perform the test, then the failed memory cell (e.g., weak memory cell) may be located and repaired. For example, redundancy may be used to swap out the identified weak memory cells so that when the weak memory cells fail, the data located in the weak memory cells will not be lost. In addition, memory devices in use in the field may be monitored and tested, and the weak memory cells may be repaired. For example, the remote device 216 may be configured to provide the wireless activation signal 246 to the controller 108 to test the memory 104. After the memory 104 is tested and the weak memory cell locations are identified, the controller 108 may be configured to repair or compensate for the weak memory cells by using redundancy or other mechanisms (e.g., substrate biasing to increase the read and write margin) so that the data provided to the location of the weak memory cell is not lost. Thus, an enhanced method 300 of measuring or characterizing susceptibility to NBTI and aging in a memory is provided The enhanced method 300 further provides remote testing and repair of susceptible memory cells in the memory.

Figure 4:
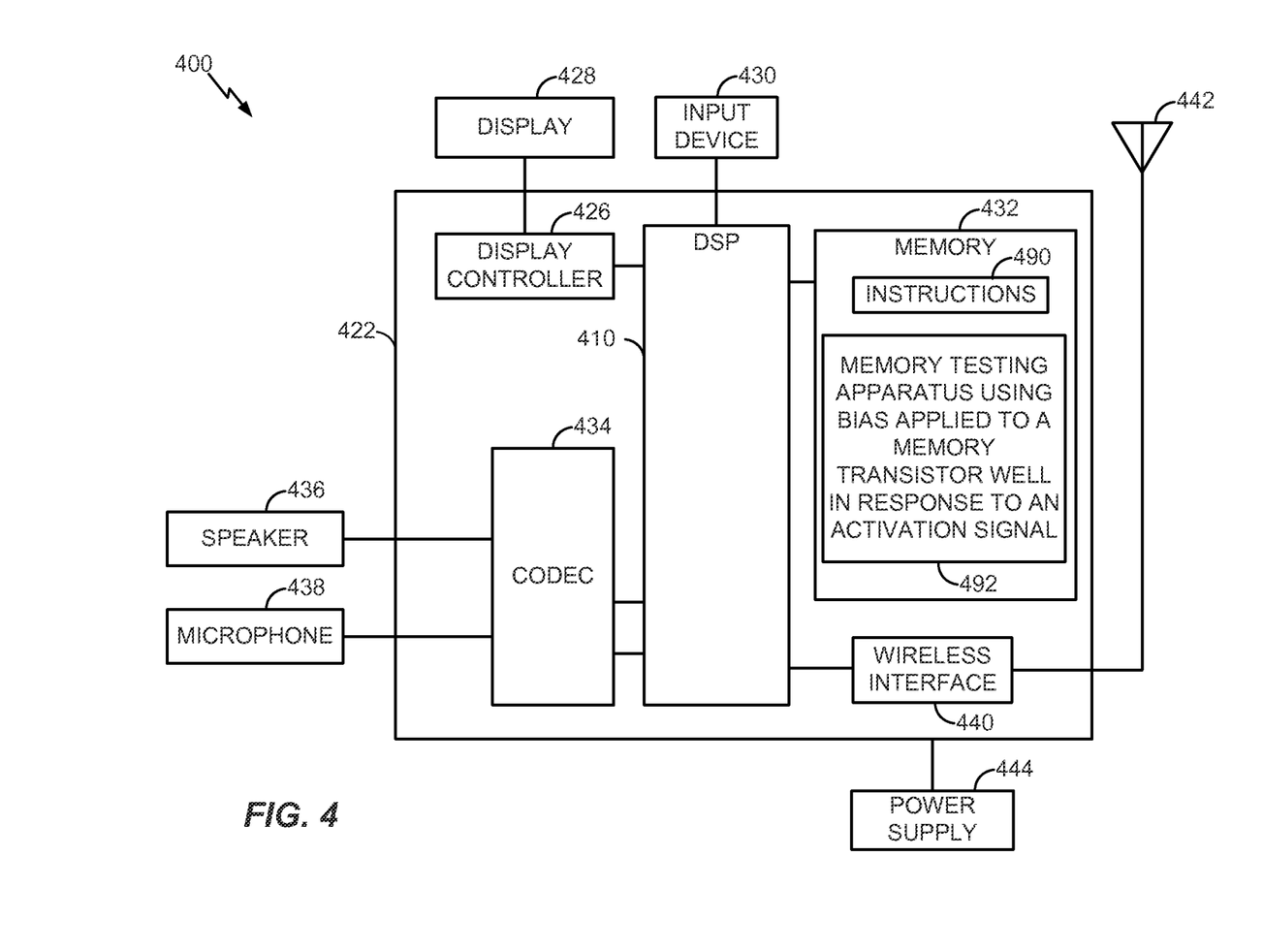
FIG. 4 is a block diagram of a portable device including an apparatus for testing a memory.

Referring to FIG. 4, a block diagram of a particular illustrative embodiment of an electronic device including an apparatus for testing a memory is depicted and generally designated 400. The device 400 includes a processor, such as a digital signal processor (DSP) 410, coupled to a memory 432 and also coupled to a memory testing apparatus 492. In an illustrative example, the memory testing apparatus 492 may include the controller 108 configured to receive the activation signal 138 depicted in FIGS. 1-2, may operate in accordance with the method of FIG. 3, or any combination thereof.

In an illustrative embodiment, the memory 432 is a computer-readable storage medium storing executable instructions 490 that are executable to cause a controller within the testing apparatus 492 to implement at least a portion of the method of FIG. 3, or any combination thereof. For example, the instructions 490 may be executable to enable receiving a testing activation signal at the testing apparatus 492 and to initiate biasing of a well of at least one transistor 432, or another device, in response to the received testing activation signal, where the bias is provided by a biasing circuit responsive to the controller. The instructions 490 may be executable to perform a test of the memory 432, or another device, to generate testing data. while the well is biased and to evaluate the testing data.

FIG. 4 also shows a display controller 426 that is coupled to the digital signal processor 410 and to a display 428. A coder/decoder (CODEC) 434 can also be coupled to the digital signal processor 410. A speaker 436 and a microphone 438 can be coupled to the CODEC 434.

FIG. 4 also indicates that a wireless interface 440 can be coupled to the digital signal processor 410 and to a wireless antenna 442. In a particular embodiment, the DSP 410, the display controller 426, the memory 432, the CODEC 434, the wireless interface 440, and the memory testing apparatus 492 are included in a system-in-package or system-on-chip device 422. In a particular embodiment, an input device 430 and a power supply 444 are coupled to the system-on-chip device 422. Moreover, in a particular embodiment, as illustrated in FIG. 4, the display 428, the input device 430, the speaker 436, the microphone 438, the wireless antenna. 442, and the power supply 444 are external to the system-on-chip device 422. However, each of the display 428, the input device 430, the speaker 436, the microphone 438, the wireless antenna 442, and the power supply 444 can be coupled to a component of the system-on-chip device 422 such as an interface or a controller.

Those of skill would further appreciate that the various illustrative logical blocks, configurations, modules, circuits, and algorithm steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium, In the alternative, the storage medium may be integral to the processor. The processor and the storage medium may reside in an application-specific integrated circuit (ASIC), The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of testing a semiconductor device, the method comprising:
    receiving a testing activation signal at a controller coupled to the semiconductor device;
    biasing a well of at least one transistor of the semiconductor device in response to the received testing activation signal, wherein the bias is provided by a biasing circuit responsive to the controller;
    performing a test of the semiconductor device to generate testing data while the well is biased; and
    measuring a value corresponding to a susceptibility of the semiconductor device to an aging effect based on the testing data.

2. The method of claim 1, wherein the biasing of the well simulates an aging effect, and wherein the measured value indicates a state of the at least one transistor of the semiconductor device after a particular test iteration.

3. The method of claim 2, wherein the state of the at least one transistor is one of a failed state and a pass state, and wherein a change of the state during the particular test iteration indicates the susceptibility to an aging effect at a bias voltage level applied to the well during the particular test iteration.

4. The method of claim 1, wherein the at least one transistor includes an n-channel metal-oxide semiconductor field effect transistor (NMOS) and the well includes a p-well of the NMOS.

5. The method of claim 1, wherein the at least one transistor includes a p-channel metal-oxide semiconductor field effect transistor (PMOS) and the well includes an n-well of the PMOS.

6. The method of claim 5, wherein the testing activation signal is received from a device remote to the controller.

7. The method of claim 1, wherein the testing activation signal indicates a plurality of test parameters, wherein the plurality of test parameters includes a first voltage level and a number of iterations to perform the test, wherein performing the test further comprises performing a plurality of test iterations based on the plurality of test parameters, and wherein during a first test iteration the well is biased based on the first voltage level.

8. The method of claim 7, wherein the plurality of test parameters further includes a voltage increment and wherein during a second test iteration the well is biased based on a second voltage level that is equal to a sum of the first voltage level and the voltage increment.

9. The method of claim 1, wherein the semiconductor device comprises a memory device, wherein performing the test comprises performing a data operation, the data operation comprising at least one of:
    a data write operation to the memory device; and
    a data read operation from the memory device.

10. The method of claim 9, wherein performing the test further comprises performing a plurality of test iterations, and wherein the method further comprises evaluating the testing data, wherein the testing data indicates an operation performed during each of the plurality of test iterations, a voltage level applied to the well during each of the plurality of test iterations, and an outcome of performing the operation during each of the plurality of test iterations.

11. The method of claim 10, wherein evaluating the testing data further comprises determining that at least a portion of the semiconductor device fails when the semiconductor device fails to correctly execute the data operation.

12. The method of claim 11, wherein evaluating the testing data further comprises determining a threshold voltage shift at an applied bias voltage level.

13. The method of claim 11. further comprising automatically repairing the failed portion of the semiconductor device by employing substrate biasing.

14. The method of claim 1, wherein performing the test further comprises sequentially applying multiple bias voltage levels to the well to determine an approximate bias voltage level at which the semiconductor device fails.

15. The method of claim 1, wherein an operation of the semiconductor device fails at a first applied bias voltage, and wherein performing the test further comprises sequentially applying multiple additional bias voltage levels to the well to determine an approximate bias voltage level at which the operation is performed correctly.

16. An apparatus comprising:
    a bias circuit configured to provide a bias voltage to a well terminal of at least one transistor of a semiconductor device; and
    a controller coupled to the bias circuit, the controller comprising:
        an activation interface configured to receive an activation signal;
        a bias circuit interface configured to send an enable signal to the bias circuit in response to the activation signal; and
        a semiconductor device interface configured to:
            send a control signal to the semiconductor device to initiate a test of the semiconductor device;
            receive testing data from the semiconductor device corresponding to the test of the semiconductor device; and
            measure a value corresponding to a susceptibility of the semiconductor device to an aging effect based on the testing data, wherein providing the biasing voltage to the well simulates an aging effect, wherein the measured value indicates a state of a first transistor of the semiconductor device after a particular test iteration, wherein the state of the first transistor is one of a failed state and a pass state, and wherein a change of the state during the particular test iteration indicates the susceptibility of the semiconductor device to an aging effect at the bias voltage applied to the well during the particular test iteration.

17. The apparatus of claim 16, wherein the activation signal indicates a plurality of test parameters, wherein the plurality of test parameters includes a number of iterations, a first voltage level, and a voltage level increment value, wherein the number of iterations indicates a number of test iterations, wherein each test iteration corresponds to a test of the semiconductor device, wherein during a first test iteration the bias voltage corresponds to the first voltage level, and wherein the bias voltage is incremented during one or more additional test iterations based on the voltage level increment value.

18. The apparatus of claim 16, wherein the at least one transistor includes an n-channel metal-oxide semiconductor field effect transistor (NMOS) and the well includes a p-well of the NMOS.

19. The apparatus of claim 16, wherein the controller is a built-in self-test (BIST) controller on the semiconductor device.

20. The apparatus of claim 16, wherein the semiconductor device is a memory, wherein the bias circuit interface is coupled to the biasing circuit and configured to receive the bias voltage from the biasing circuit, wherein the bias circuit interface is further configured to provide the received bias voltage to the memory.

21. The apparatus of claim 16, wherein the biasing circuit comprises a charge pump.

22. The apparatus of claim 16, wherein the biasing circuit is external to the semiconductor device.

23. The apparatus of claim 16, further comprising a device selected from the group consisting of a set top box, a music player, a video player, an entertainment unit, a navigation device, a communications device, a personal digital assistant (PDA), a fixed location data unit, and a computer, into which the controller is integrated.

24. An apparatus comprising:
   means for receiving a testing activation signal at a controller coupled to a memory device of a semiconductor device;
   means for biasing a well of at least one transistor of the memory device in response to the received testing activation signal, wherein the bias is provided by a biasing circuit responsive to the controller;
   means for performing a test of the memory device to generate testing data while the well is biased; and
   means for measuring a value corresponding to a susceptibility of the semiconductor device to an aging effect based on the testing data.

25. A non-transitory computer-readable storage medium storing instructions that, when executed by a processor, cause the processor to:
   receive a testing activation signal at a controller coupled to a semiconductor device;
   bias a well of at least one transistor of the semiconductor device in response to the received testing activation signal, wherein a bias voltage is provided by a biasing circuit responsive to the controller;
   perform a test of the semiconductor device to generate testing data while the well is biased; and
   measure a value corresponding to a susceptibility of the semiconductor device to an aging effect based on the testing data.

* * * * *